United States Patent
Kimura

(10) Patent No.: US 7,999,602 B2
(45) Date of Patent: Aug. 16, 2011

(54) SWITCHING CONTROL CIRCUIT

(75) Inventor: Kengo Kimura, Niiza (JP)

(73) Assignee: Sanken Electric Co., Ltd., Niiza-Shi, Saitama (JP)

( * ) Notice: Subject to any disclaimer, the term of this patent is extended or adjusted under 35 U.S.C. 154(b) by 43 days.

(21) Appl. No.: 12/561,869

(22) Filed: Sep. 17, 2009

(65) Prior Publication Data

US 2010/0090541 A1    Apr. 15, 2010

(30) Foreign Application Priority Data

Sep. 24, 2008  (JP) .................................. 2008-243969

(51) Int. Cl.
*H03K 17/56*  (2006.01)

(52) U.S. Cl. .......................... 327/424; 327/433; 327/494

(58) Field of Classification Search .................. 327/408, 327/423, 424, 494, 588
See application file for complete search history.

(56) References Cited

U.S. PATENT DOCUMENTS

| | | | | |
|---|---|---|---|---|
| 5,365,118 A | * | 11/1994 | Wilcox | 327/109 |
| 5,408,150 A | * | 4/1995 | Wilcox | 327/108 |
| 5,514,981 A | | 5/1996 | Tam et al. | |
| 5,565,715 A | * | 10/1996 | Doluca | 307/130 |
| 5,777,496 A | * | 7/1998 | Herman | 327/108 |
| 6,147,545 A | * | 11/2000 | Marshall | 327/424 |
| 6,687,142 B2 | * | 2/2004 | Scott | 363/97 |

FOREIGN PATENT DOCUMENTS

JP    8-65143 A    3/1996

* cited by examiner

*Primary Examiner* — Hai L Nguyen

(74) *Attorney, Agent, or Firm* — Birch, Stewart, Kolasch & Birch, LLP

(57) ABSTRACT

It is possible to reliably prevent two switching elements comprising a half-bridge circuit from turning ON simultaneously even when two pulse signals allowing both the two switching elements to turn ON are input thereto.

A first drive signal is allowed to be output from a first output terminal 4 to a P-type MOSFET 10 based on a first pulse signal and a second pulse signal, and a second drive signal is allowed to be output from a second output terminal 5 to an N-type MOSFET 11 that operates as a second switching element based on the first pulse signal and the second pulse signal, and a protecting circuit 20 is configured to allow at least one of the P-type MOSFET 10 and the N-type MOSFET 11 to turn OFF.

3 Claims, 6 Drawing Sheets

FIG. 2

| CKI1 | CKI2 | A | B | DRV1 | DRV2 | MOS1 | MOS2 |
|---|---|---|---|---|---|---|---|
| L | L | H | H | H | L | OFF | OFF |
| L | H | H | L | H | H | OFF | ON |
| H | L | L | H | L | L | ON | OFF |
| H | H | H | H | H | L | OFF | OFF |

FIG. 5

| CKI1 | CKI2 | A | B | DRV1 | DRV2 | MOS1 | MOS2 |
|---|---|---|---|---|---|---|---|
| L | L | H | H | L | L | OFF | OFF |
| L | H | H | L | L | H | OFF | ON |
| H | L | L | H | H | L | ON | OFF |
| H | H | H | H | L | L | OFF | OFF |

SWITCHING CONTROL CIRCUIT

BACKGROUND OF THE INVENTION

1. Field of the Invention

The present invention relates to a switching control circuit for controlling the drive of a first switching element and a second switching element of a half-bridge circuit connected to a DC power source.

2. Description of the Related Art

Formally, two switching elements comprising a half-bridge circuit, for example, MOSFETs (Metal Oxide Semiconductor Field Effect Transistors), are connected in series to each other and turn ON/OFF based on a pulse signal supplied from a power integrated circuit (control circuit) so as to supply power from a DC power source to a load.

In such MOSFETs comprising a half-bridge circuit, when they turns ON simultaneously, they may be heated by through current conducting each MOSFET, resulting in emission of smoke, occurrence of fires, or destruction. Thus, a countermeasure is taken in which the two MOSFETs do not turn ON simultaneously.

As refer to Patent Document 1 as an example of a circuit in which such a countermeasure has been taken, a reset dominant level-shift circuit is proposed in which the high side MOSFET is made reset dominant in order to prevent the two MOSFETs from turning ON simultaneously due to malfunction of a power integrated circuit which is caused by an unexpected noise pulse.

Patent Document 1 refers to Japanese Patent Application No. JP-A-08-065143

SUMMARY OF THE INVENTION

As refer to the abovementioned Patent Document 1 of the reset dominant level-shift circuit, the high side MOSFET comprising a half-bridge circuit is made reset dominant, so that if a power integrated circuit malfunctions due to occurrence of an unexpected noise pulse from peripheral devices, it is possible to prevent the two MOSFETs from turning ON simultaneously.

However, in the case where, for example, two pulse signals are input from an external circuit to the control circuit, if an abnormality (abnormal state) occurs in which a line for transmitting the two pulse signals is short-circuited with a line having a predetermined potential, two pulse signals, such as, allowing the high side and low side MOSFETs to turn ON simultaneously are input. As a result, there was a problem that the simultaneous turning ON of the two MOSFETs cannot be prevented.

The present invention has been made in view of the above situation, and an object thereof is to provide a switching control circuit capable of reliably preventing two switching elements comprising a half-bridge circuit from turning ON simultaneously even when two pulse signals allowing both the two switching elements to turn ON are input thereto.

The switching control circuit of the present invention is a switching control circuit for driving a first switching element and a second switching element comprising a half-bridge circuit, the circuit comprising: a first output terminal that outputs a first drive signal to the first switching element based on a first pulse signal and a second pulse signal; a second output terminal that outputs a second drive signal to the second switching element based on the first pulse signal and the second pulse signal; and a protecting circuit that outputs the first drive signal and the second drive signal that turn OFF at least one of the first switching element and the second switching element upon inputting the first pulse signal and the second pulse signal.

Also, the protecting circuit is configurable to have a logic circuit configured to allow the first drive signal and the second drive signal that turn OFF the first switching element and the second switching element respectively to be output, when the first pulse signal and the second pulse signal are signals that turn ON the first switching element and the second switching element respectively.

Also, the protecting circuit is configurable to have a logic circuit configured to allow the first drive signal and the second drive signal that turn OFF the first switching element and the second switching element respectively to be output, when the first pulse signal and the second pulse signal are signals that turn OFF the first switching element and the second switching element respectively.

Also, the switching control circuit is configurable to have the first drive signal has a predetermined "both-OFF" period, which is set in the circuit, immediately before turning-ON of the first switching elements, and the second drive signal has a predetermined "both-OFF" period, which is set in the circuit, immediately before turning-ON of the second switching elements.

In the switching control circuit of the present invention, it is comprising the steps of: outputting a first drive signal to the first switching element based on a first pulse signal and a second pulse signal; outputting a second drive signal to the second switching element based on the first pulse signal and the second pulse signal; and turning OFF at least one of the first switching element and the second switching element upon inputting the first pulse signal and the second pulse signal by a protecting circuit.

The switching control circuit according the present invention has a configuration in which at least one of a first switching element and a second switching element turn OFF by a protecting circuit when a first pulse signal and a second pulse signal are input, so that it is possible to reliably prevent the two switching elements comprising a half-bridge circuit from turning ON simultaneously even when two pulse signals allowing both the two switching elements to turn ON are input thereto.

BRIEF DESCRIPTION OF THE DRAWINGS

FIG. 2 is a view showing the logic output by a protecting circuit of FIG. 1;

FIG. 5 is a view showing the logic output of a protecting circuit of FIG. 4.

DETAILED DESCRIPTION OF THE INVENTION

First Embodiment

An embodiment of the present invention will be described in detail below with reference to the accompanying drawings.

Figure 1:
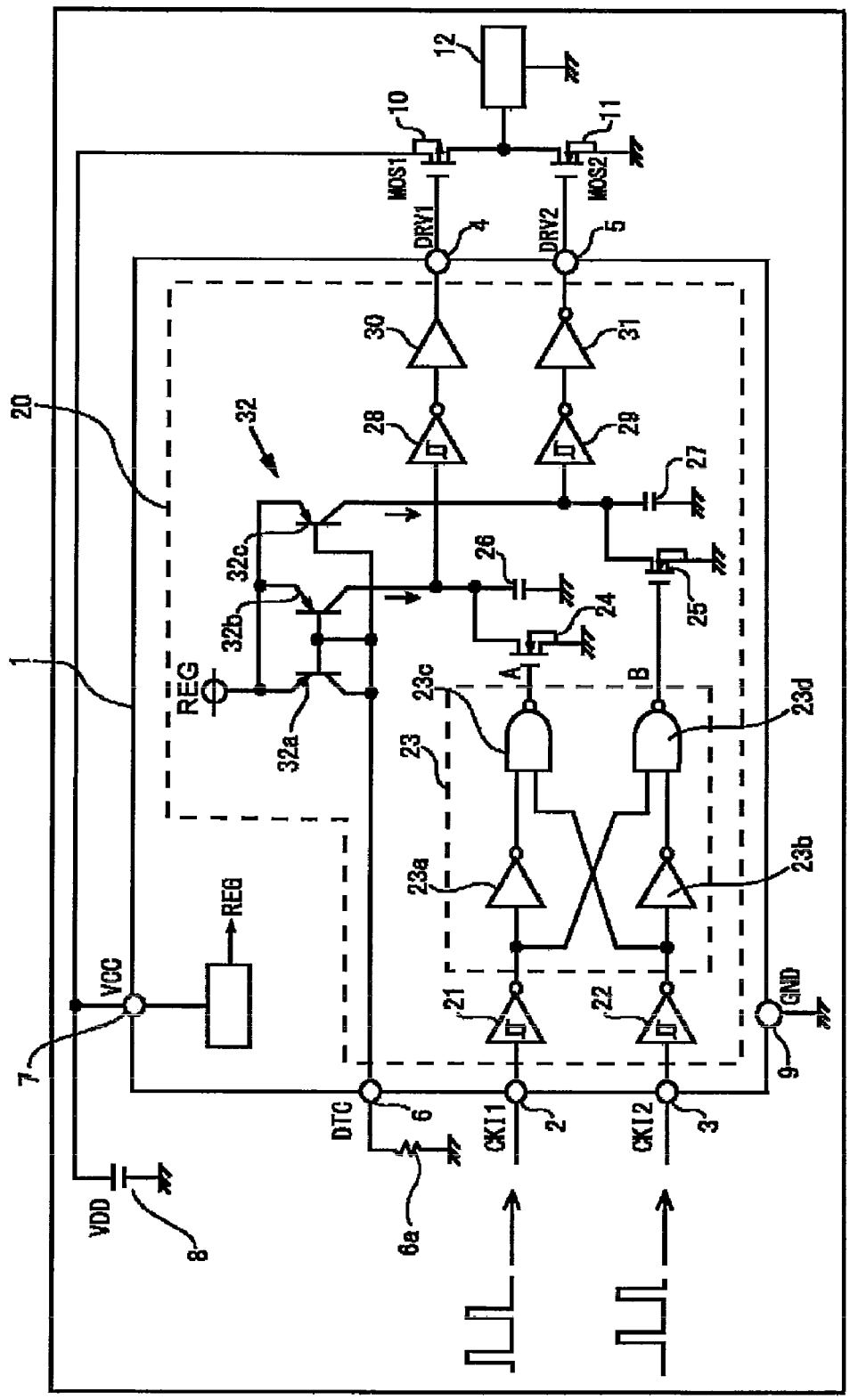
FIG. 1 is a circuit diagram showing a first embodiment of a switching control circuit according to the present invention.

FIG. 1 is a circuit diagram showing a first embodiment of a switching control circuit according to the present invention.

Firstly, as shown in FIG. 1, a switching control circuit 1 includes a first input terminal (CKI1) 2, a second input terminal (CKI2) 3, a first output terminal (DRV1) 4, a second output terminal (DRV2) 5, a "both-OFF" period (DTC) determining terminal 6, a power source voltage (VCC) input terminal 7, and a protecting circuit 20. Further, reference numeral 8 denotes a DC power source (VDD), reference numeral 9 denotes a GND terminal, reference numeral 10 denotes a high side P-type MOSFET (MOS1) composing a half-bridge circuit in high side, reference numeral 11 denotes a low-side N-type MOSFET (MOS2) composing the half-bridge circuit in low side, and reference numeral 12 denotes a load.

A first pulse signal from an external device, such as a microcomputer, is input to the first input terminal 2. A second pulse signal from an external device, such as a microcomputer, is input to the second input terminal 3.

The first output terminal 4 outputs a first drive signal that the switching control circuit 1 generates based on the first pulse signal and the second pulse signal to the gate terminal of the P-type MOSFET 10 to turn ON/OFF the P-type MOSFET 10. The second output terminal 5 outputs a second drive signal that the switching control circuit 1 generates based on the first pulse signal and the second pulse signal to the gate terminal of the N-type MOSFET 11 to turn ON/OFF the N-type MOSFET 11.

The "both-OFF" period determining terminal 6 determines the dead time of the P-type MOSFET 10 and the N-type MOSFET 11. Here, the dead time is determined based on the current value of a constant current circuit 32 to be described later, resistance value of a resistor 6a connected to the "both-OFF" period determining terminal 6, and capacitance of capacitors 26 and 27 to be described later. A drive power source required for the switching control circuit 1 to operate is input to the power source voltage input terminal 7.

The protecting circuit 20 includes NOT gates 21 and 22, a logic circuit 23, N-type MOSFETs 24 and 25, capacitors 26 and 27, NOT gates 28 and 29, a driver gate 30, a NOT gate 31, and a constant current circuit 32.

The NOT gates 21 and 22 are NOT gates each having hysteresis property and invert the first pulse signal and the second pulse signal to be input to the first input terminal 2 and the second input terminal 3 from H (High) to L (Low) or from L to H.

The logic circuit 23 includes NOT gates 23a and 23b, and NAND gates 23c and 23d. The NOT gates 23a and 23b invert the outputs of the NOT gates 21 and 22 from H to L or from L to H.

The NAND gate 23c outputs L only when both the output of the NOT gate 23a and the output of the NOT gate 22 are H and, otherwise, outputs H. The NAND gate 23d outputs L only when both the output of the NOT gate 23b and the output of the NOT gate 21 are H and, otherwise, outputs H.

The N-type MOSFETs 24 and 25 turn ON when the output from the NAND gates 23c and 23d are H. The capacitors 26 and 27 are charged when the N-type MOSFETs 24 and 25 turn OFF based on a current output from the constant current circuit 32 and are discharged when the N-type MOSFETs 24 and 25 turn ON.

The constant current circuit 32 includes a current mirror circuit comprising transistors 32a and 32b of, e.g., a PNP-type and a current mirror circuit comprising transistors 32a and 32c of the same PNP-type. Subsequently, the dead time is to be determined based on the resistance value of the resistor 6a connected to the "both-OFF" period determining terminal 6 and capacitance of the capacitors 26 and 27.

The NOT gates 28 and 29 are NOT gates, and each having hysteresis property and invert the outputs of the N-type MOSFETs 24 and 25, namely to the outputs of the capacitors 26 and 27, from H to L or from L to H.

The driver gate 30 outputs the output of the NOT gate 28 to the gate terminal of the P-type MOSFET 10 without performing the inversion. The NOT gate 31 inverts the output of the NOT gate 29 from H to L or from L to H and outputs the resultant output to the gate terminal of the N-type MOSFET 11.

Figure 3:
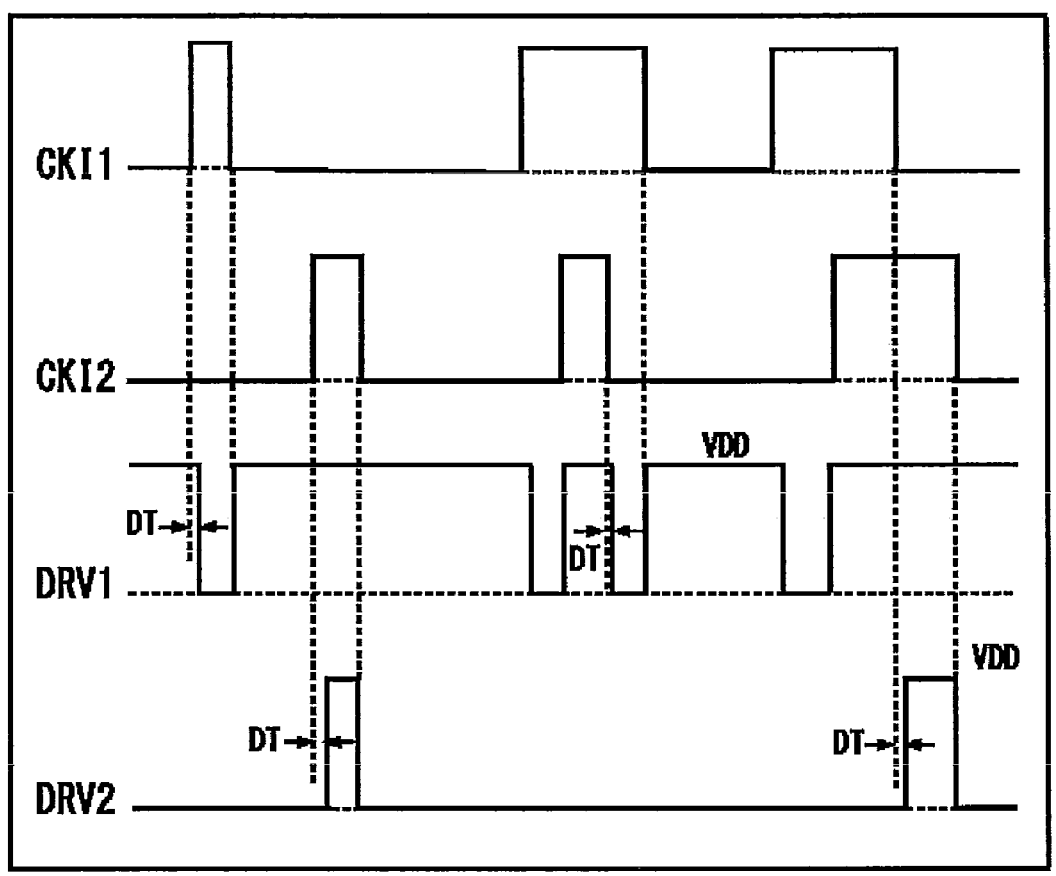
FIG. 3 is a timing chart for explaining pulse signals input to the switching control circuit of FIG. 1 and pulse signals output from the switching control circuit.

Then, operation of the switching control circuit 1 in FIG. 1 will be described by referencing with FIG. 2 and FIG. 3. Here, FIG. 2 is a view showing the logic output of the protecting circuit 20 of FIG. 1, and FIG. 3 is a timing chart for explaining pulse signals input to the switching control circuit 1 in FIG. 1 and pulse signals output from the switching control circuit 1.

Firstly, as shown in FIG. 2, in the case where both the first pulse signal and the second pulse signal input respectively to the first input terminal (CKI1) 2 and the second input terminal (CKI2) 3 are L, both A and B which are the outputs from the NAND gates 23c and 23d are H. At this time, the output from the first output terminal (DRV1) 4 is H, and the output from the second output terminal (DRV2) 5 is L, so that both the P-type MOSFET (MOS1) 10 and the N-type MOSFET (MOS2) 11 turn OFF.

Then, in the case where the first pulse signal input to the first input terminal (CKI1) 2 is L and where second pulse signal input to the second input terminal (CKI2) 3 is H, A which is the output from the NAND gate 23c is H, and B which is the output from the NAND gate 23d is L. At this time, both the outputs from the first output terminal (DRV1) 4 and the second output terminal (DRV2) 5 are H, so that the P-type MOSFET (MOS1) 10 tunes OFF and the N-type MOSFET (MOS2) 11 turns ON.

Then, in the case where the first pulse signal input to the first input terminal (CKI1) 2 is H and where second pulse signal input to the second input terminal (CKI2) 3 is L, A which is the output from the NAND gate 23c is L, and B which is the output from the NAND gate 23d is H. At this time, both the outputs from the first output terminal (DRV1) 4 and the second output terminal (DRV2) 5 are L, so that the P-type MOSFET (MOS1) 10 tunes ON and the N-type MOSFET (MOS2) 11 turns OFF.

Then, in the case where both the first pulse signal and the second pulse signal input respectively to the first input terminal (CKI1) 2 and the second input terminal (CKI2) 3 are H, both A and B which are the outputs from the NAND gate 23c and the NAND gate 23d are H. At this time, the output from the first output terminal (DRV1) 4 is H, and the output from the second output terminal (DRV2) 5 is L, so that both the P-type MOSFET (MOS1) 10 and the N-type MOSFET (MOS2) 11 turn OFF.

Thus, as described above, even when pulse signals allowing both the P-type MOSFET 10 and the N-type MOSFET 11 to turn ON, i.e., both the first pulse signal input to the first input terminal (CKI1) 2 and the second pulse signal input to the second input terminal (CKI2) 3 are H, the logic circuit 23 in the protecting circuit 20 makes the output from the first output terminal (DRV1) 4 H and the output from the second output terminal (DRV2) 5 L. As a result, both the P-type MOSFET (MOS1) 10 and the N-type MOSFET (MOS2) 11 turn OFF and, thereby, occurrence of a negative effect due to the simultaneous turning ON of the P-type MOSFET 10 and the N-type MOSFET 11 can be eliminated.

Subsequently, generation of the dead time by the constant current circuit 32 will be described. The constant current circuit 32 includes a current mirror circuit comprising transistors 32a and 32b of, e.g., a PNP-type and a current mirror circuit comprising the same PNP-type transistors 32a and 32c. The connecting point between the base terminals of the PNP-type transistors 32a, 32b, and 32c is connected to the collector terminal of the PNP-type transistor 32a and one end of the resistor 6a. The other end of the resistor 6a is grounded. The connecting point between the emitter terminals of the PNP-type transistors 32a, 32b, and 32c, respectively, is connected to an internal regulator REG. The collector terminal of the PNP-type transistor 32b is connected to the connecting point between the drain terminal of the N-type MOSFET 24, one end of the capacitor 26, and the input terminal of the NOT gate 28. The collector terminal of the PNP-type transistor 32c is connected to the connecting point between the drain terminal of the N-type MOSFET 25, one end of the capacitor 27, and the input terminal of the NOT gate 29. A current from the PNP-type transistors 32b and 32c is determined by the resistance value of the resistor 6a connected to the "both-OFF" period determining terminal 6.

The current from the PNP-type transistors 32b and 32c flows to GND through the N-type MOSFETs 24 and 25 when the N-type MOSFETs 24 and 25 are ON; while it flows to the capacitors 26 and 27 when the N-type MOSFETs 24 and 25 are OFF, resulting in being charged. Subsequently, the charge that has been accumulated in the capacitors 26 and 27 when the N-type MOSFETs 24 and 25 are ON is discharged to GND through the N-type MOSFETs 24 and 25, and the voltage reaches about 0V (ON-voltage of the N-type MOSFETs 24 and 25). When the N-type MOSFETs 24 and 25 turn OFF, current from the PNP-type transistors 32b and 32c flows to the capacitors 26 and 27 and, then, the capacitors 26 and 27 are charged with a constant current value determined by the resistance value of the resistor 6a, so that the voltage thereof linearly increases.

The voltage of the capacitors 26 and 27 is linearly increased from about 0V with a constant current from the transistors 32b and 32c. When the inputs of the NOT gates 28 and 29 reach a threshold of output inversion, signals from the N-type MOSFETs 24 and 25 are inverted from H to L. At this time, the timing at which the signals of the NOT gates 28 and 29 change to L is delayed by the time taken from the timing at which the signals of the N-type MOSFETs 24 and 25 are changed to L to the timing at which the inputs of the NOT gates 28 and 29 reach a threshold of output inversion.

The above delay time corresponds to the dead time (DT). The driver gate 30 directly outputs the output of the NOT gate 28 without performing the inversion, and the NOT gate 31 inverts the output of the NOT gate 29 from H to L or from L to H and outputs the resultant output. FIG. 3 shows the signals of the DRV1 and DRV2 to which dead time DT has been added.

As shown in FIG. 3, both the P-type MOSFET 10 and the N-type MOSFET 11 are controlled to shift from an OFF-state to ON-state with the dead time (DT) determined by the above-mentioned "both-OFF" period determining terminal 6 taken into consideration, so that even when the P-type MOSFET 10 and the N-type MOSFET 11 operate with OFF-time, simultaneous turning ON thereof can reliably be prevented.

As described above, in the first embodiment, based on the first pulse signal and second pulse signal, the logic circuit 23 in the protecting circuit 20 is configured to allow the first drive signal to be output from the first output terminal 4 to P-type MOSFET 10 only when the first pulse signal is H and the second pulse signal is L and allow the first drive signal to be output from the second output terminal 5 to N-type MOSFET 11 only when the second pulse signal is H and the first pulse signal is L.

Further, the logic circuit 23 in the protecting circuit 20 is configured to allow at least one of the P-type MOSFET 10 and the N-type MOSFET 11 to turn OFF. Therefore, even when two pulse signals allowing the MOSFET 10 and the N-type MOSFET 11 composing a half-bridge circuit, to turn ON simultaneously are input, it is possible to reliably prevent simultaneous turning ON of the P-type MOSFET 10 and the N-type MOSFET 11.

Further, in the first embodiment, the first drive signal has dead time, which is a predetermined "both-OFF" period determined by the "both-OFF" period determining terminal 6, immediately before the P-type MOSFET 10 turns ON, and the second drive signal has dead time, which is a predetermined "both-OFF" period determined by the "both-OFF" period determining terminal 6, immediately before the N-type MOSFET 11 turns ON. Thus, both the P-type MOSFET 10 and the N-type MOSFET 11 are controlled to shift from an OFF-state to ON-state with the dead time, so that even when the P-type MOSFET 10 and the N-type MOSFET 11 operate with OFF-time, simultaneous turning ON thereof can reliably be prevented.

Further, in the first embodiment, the switching control circuit 1 has the first input terminal 2 which is a first input terminal to which the first pulse signal is input and the second input terminal 3 which is a second input terminal to which the second pulse signal is input, so that the first pulse signal and the second pulse signal from an external device, such as a microcomputer, can be loaded through the first input terminal 2 and the second input terminal 3.

Second Embodiment

Figure 4:
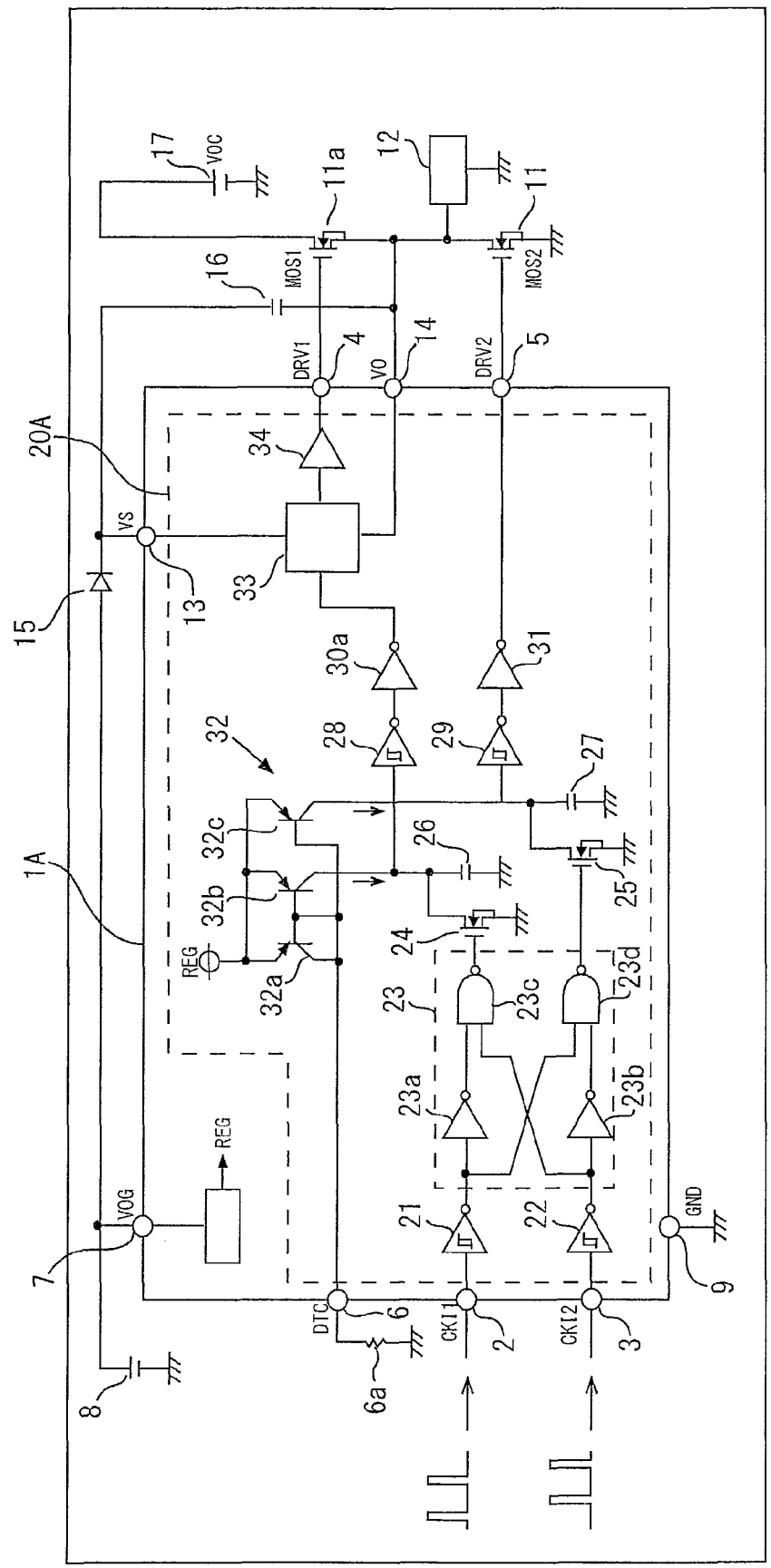
FIG. 4 is a circuit diagram showing a second embodiment in which the configuration of the switching control circuit of FIG. 1 has been modified.

FIG. 4 is a circuit diagram showing a second embodiment in which the configuration of the switching control circuit 1 of FIG. 1 has been modified. Further, in FIG. 4 and subsequent drawings, the same reference numerals as those in FIG. 1 denote the same parts as those in FIG. 1, and the overlapped descriptions will be given if necessary.

As shown in the same drawing, a switching control circuit 1A additionally includes a power source voltage input terminal 13, a level shift output terminal 14, a diode 15, a capacitor 16, and a high DC voltage power source 17. Also, the high side P-type MOSFET 10 of FIG. 1 is replaced by an N-type MOSFET 11a.

A protecting circuit 20A includes a NOT gate 30a in place of the driver gate 30 of FIG. 1 and additionally includes a level shift circuit 33 and a driver gate 34.

Here, the level shift output terminal 14 is connected between the source of the N-type MOSFET 11a and the drain of the N-type MOSFET 11. With this arrangement, the N-type MOSFET 11a uses the potential between the source of the N-type MOSFET 11a and the drain of the N-type MOSFET 11 as reference potential and performs switching operation between the reference potential and potential of the high DC voltage power source 17. Also, the N-type MOSFET 11 uses the ground potential as reference potential and performs switching operation between the reference potential and potential between the source of the N-type MOSFET 11a and the drain of the N-type MOSFET 11.

Since the high side N-type MOSFET 11a is driven by a high voltage, a pulse signal which is the first drive signal output from the first output terminal 4 to N-type MOSFET 11a is shifted to a high voltage level by the level shift circuit 33.

Then, operation of the switching control circuit 1A of FIG. 4 will be described using FIG. 5 and FIG. 6. Here, FIG. 5 is a view showing the logic output of the protecting circuit 20A of FIG. 4, and FIG. 6 is a timing chart for explaining pulse signals input to the switching control circuit 1A of FIG. 4 and pulse signals output from the switching control circuit 1A.

Firstly, as shown in FIG. 5, the logic output by the protecting circuit 20A is substantially the same as the logic output by the protecting circuit 20 of FIG. 2. However, in the second embodiment, since the P-type MOSFET 10 of FIG. 1 is replaced by the N-type MOSFET 11a as well as the driver gate 30 of FIG. 1 is replaced by the NOT gate 30a, the outputs from the first output terminal (DRV1) 4 are all inverted relative to the outputs from the first output terminal (DRV1) 4 of FIG. 1.

Thus, as described above, even when pulse signals, such as allowing both the N-type MOSFET 11a and the N-type MOSFET 11 to turn ON, i.e., both the first pulse signal and the second pulse signal input respectively to the first input terminal (CKI1) 2 and the second input terminal (CKI2) 3 are H, A which is output from the NAND gate 23c with being output of the logic circuit 23 is H, and B which is output from the NAND gate 23d is H. Accordingly, both the outputs from the first output terminal (DRV1) 4 and the second output terminal (DRV2) 5 are made L, with the result that both the N-type MOSFET (MOS1) 11a and the N-type MOSFET (MOS2) 11 turn OFF and, thereby, occurrence of a negative effect due to the simultaneous turning ON of the N-type MOSFET 11a and the N-type MOSFET 11 can be eliminated.

Figure 6:
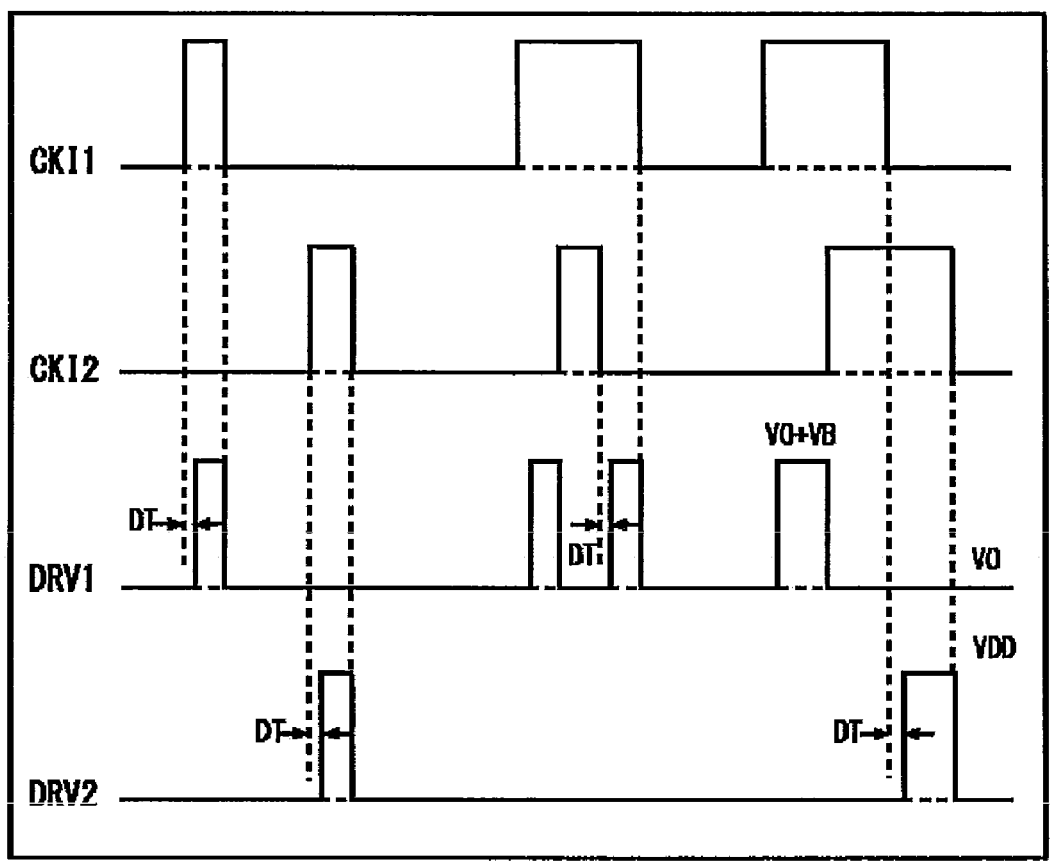
FIG. 6 is a timing chart for explaining pulse signals input to the switching control circuit of FIG. 4 and pulse signals output from the switching control circuit.

Further, as in the case of the first embodiment, in this embodiment, both the N-type MOSFET 11a and N-type MOSFET 11 are controlled to shift from an OFF-state to ON-state with the dead time (DT) determined by the above-mentioned "both-OFF" period determining terminal 6 taken into consideration as shown in FIG. 6, so that even when the N-type MOSFET 11a and the N-type MOSFET 11 operate with OFF-time, simultaneous turning ON thereof can reliably be prevented.

As described above, in the second embodiment, even when a configuration in which the high side N-type MOSFET 11a is driven by the level shift circuit 33 is employed, it is possible to reliably prevent simultaneous turning ON of the two N-type MOSFETs, which are N-type MOSFET 11a and the N-type MOSFET 11.

What is claimed is:

1. A switching control circuit for driving a first switching element and a second switching element composing a half-bridge circuit comprising:
    a first output terminal that outputs a first drive signal to the first switching element based on a first pulse signal and a second pulse signal;
    a second output terminal that outputs a second drive signal to the second switching element based on the first pulse signal and the second pulse signal;
    a first input terminal that inputs the first pulse signal from an external circuit;
    a second input terminal that inputs the second pulse signal from an external circuit; and
    a protecting circuit that outputs the first drive signal and the second drive signal that turn OFF at least one of the first switching element and the second switching element upon inputting the first pulse signal and the second pulse signal,
wherein
    the protecting circuit has a logic circuit configured to allow the first drive signal and the second drive signal that turn OFF the first switching element and the second switching element respectively to be output, when the first pulse signal and the second pulse signal are signals that turn ON the first switching element and the second switching element, respectively.

2. The switching control circuit according to claim 1, wherein
    the first drive signal has a predetermined "both-OFF" period, which is set in the circuit, immediately before turning-ON of the first switching elements, and
    the second drive signal has a predetermined "both-OFF" period, which is set in the circuit, immediately before turning-ON of the second switching elements.

3. The switching control circuit according to claim 1, wherein
    the protecting circuit has a logic circuit configured to allow the first drive signal and the second drive signal that turn OFF the first switching element and the second switching element respectively to be output, when the first pulse signal and the second pulse signal are signals that turn OFF the first switching element and the second switching element, respectively.

* * * * *